United States Patent
Oh et al.

(10) Patent No.: US 12,417,989 B2
(45) Date of Patent: Sep. 16, 2025

(54) SEMICONDUCTOR MEMORY DEVICE INCLUDING STACKED SEMICONDUCTOR LAYERS

(71) Applicant: SK hynix Inc., Icheon-si (KR)

(72) Inventors: Sung Lae Oh, Icheon-si (KR); Sang Hyun Sung, Icheon-si (KR); Hyun Soo Shin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 759 days.

(21) Appl. No.: 17/725,327

(22) Filed: Apr. 20, 2022

(65) Prior Publication Data

US 2023/0187396 A1  Jun. 15, 2023

(30) Foreign Application Priority Data

Dec. 10, 2021 (KR) .................. 10-2021-0177044

(51) Int. Cl.
| | |
|---|---|
| H01L 23/00 | (2006.01) |
| H01L 23/60 | (2006.01) |
| H01L 25/065 | (2023.01) |
| H01L 25/18 | (2023.01) |

(52) U.S. Cl.
CPC .............. *H01L 24/08* (2013.01); *H01L 23/60* (2013.01); *H01L 25/0657* (2013.01); *H01L 25/18* (2013.01); *H01L 2224/08145* (2013.01); *H01L 2924/1431* (2013.01); *H01L 2924/1434* (2013.01); *H01L 2924/30205* (2013.01)

(58) Field of Classification Search
CPC ..... H01L 24/08; H01L 23/60; H01L 25/0657; H01L 25/18; H01L 2224/08145; H01L 2924/1431; H01L 2924/1434; H01L 2924/30205; H01L 2225/06541; H01L 21/76898; H01L 23/481; H01L 25/0652; H10D 89/611; H10D 84/80; H10B 43/27

See application file for complete search history.

(56) References Cited

U.S. PATENT DOCUMENTS

| | | | | |
|---|---|---|---|---|
| 8,922,243 | B2* | 12/2014 | Jayasena | G11C 29/70 326/38 |
| 8,952,426 | B2* | 2/2015 | Maejima | H10B 43/20 257/214 |
| 9,287,271 | B2* | 3/2016 | Wang | H10B 12/053 |
| 9,437,606 | B2* | 9/2016 | Makala | H10D 88/01 |
| 9,576,973 | B2* | 2/2017 | Lee | H10B 43/10 |
| 9,613,689 | B1* | 4/2017 | Takaki | H01L 23/528 |
| 9,679,907 | B1* | 6/2017 | Kaneko | H10B 43/35 |

(Continued)

FOREIGN PATENT DOCUMENTS

| | | |
|---|---|---|
| KR | 10-2022-0005200 A | 1/2022 |
| KR | 10-2022-0052749 A | 4/2022 |

*Primary Examiner* — Caleb E Henry (57) ABSTRACT

A semiconductor memory device includes a first semiconductor layer including a memory cell array; a second semiconductor layer including a first substrate and a page buffer circuit which is configured on the first substrate; a third semiconductor layer disposed between the first semiconductor layer and the second semiconductor layer in a vertical direction, and including a second substrate and a second logic circuit which is configured on an element region of the second substrate; and a first contact plug passing through a coupling region of the second substrate which overlaps the page buffer circuit in the vertical direction.

18 Claims, 8 Drawing Sheets

(56) References Cited

U.S. PATENT DOCUMENTS

| | | | |
|---|---|---|---|
| 9,875,929 B1* | 1/2018 | Shukla | H10B 43/27 |
| 10,141,221 B1* | 11/2018 | Lai | H01L 21/76831 |
| 10,163,924 B2* | 12/2018 | Ahn | H10B 41/27 |
| 10,217,746 B1* | 2/2019 | Kim | H10B 63/845 |
| 10,290,648 B1* | 5/2019 | Zhou | H10B 41/27 |
| 10,354,980 B1* | 7/2019 | Mushiga | H01L 23/5226 |
| 10,381,443 B2* | 8/2019 | Matsumoto | H10B 43/27 |
| 10,510,738 B2* | 12/2019 | Kim | H01L 24/80 |
| 10,515,897 B2* | 12/2019 | Nishikawa | H01L 21/76847 |
| 10,515,907 B2* | 12/2019 | Fujita | H10B 43/27 |
| 10,522,624 B2* | 12/2019 | Van Houdt | H10N 70/20 |
| 10,559,582 B2* | 2/2020 | Nishikawa | H10B 43/27 |
| 11,183,246 B1* | 11/2021 | Oh | G11C 16/08 |
| 11,563,021 B2* | 1/2023 | Huang | H10B 43/35 |
| 2010/0109164 A1* | 5/2010 | Kang | H01L 24/82 438/109 |
| 2010/0195364 A1* | 8/2010 | Riho | H10D 89/931 365/63 |
| 2015/0016172 A1* | 1/2015 | Loh | G06F 3/0608 365/51 |
| 2016/0118399 A1* | 4/2016 | Son | H10B 43/40 257/314 |
| 2016/0196863 A1* | 7/2016 | Shin | G11C 11/406 365/222 |
| 2016/0254240 A1* | 9/2016 | Chen | H01L 24/05 257/738 |
| 2016/0365352 A1* | 12/2016 | Nishikawa | H10B 43/10 |
| 2017/0053906 A1* | 2/2017 | Or-Bach | H10B 43/20 |
| 2017/0110160 A1* | 4/2017 | Seo | G11C 5/063 |
| 2017/0162597 A1* | 6/2017 | Sharangpani | H01L 21/02178 |
| 2017/0236836 A1* | 8/2017 | Huo | H10D 1/00 257/324 |
| 2018/0277556 A1* | 9/2018 | Kang | H10B 43/10 |
| 2018/0342557 A1* | 11/2018 | Mori | H10N 70/823 |
| 2019/0043836 A1 | 2/2019 | Fastow et al. | |
| 2019/0074290 A1* | 3/2019 | Xiao | H10D 30/696 |
| 2019/0164991 A1 | 5/2019 | Lim et al. | |
| 2019/0355735 A1* | 11/2019 | Kothari | H10B 41/27 |
| 2020/0051904 A1* | 2/2020 | Tang | H01L 23/528 |
| 2020/0126974 A1* | 4/2020 | Liu | H10D 62/292 |
| 2020/0185307 A1* | 6/2020 | Tsai | H01L 25/18 |
| 2020/0227398 A1* | 7/2020 | Oh | G11C 16/0483 |
| 2020/0350203 A1* | 11/2020 | Fratin | H10B 63/845 |
| 2020/0388650 A1* | 12/2020 | Nardi | G11C 13/0026 |
| 2020/0395407 A1* | 12/2020 | Takahashi | H10N 70/066 |
| 2020/0395408 A1* | 12/2020 | Takahashi | H10B 63/845 |
| 2020/0402988 A1* | 12/2020 | Howder | H10B 43/27 |
| 2020/0403033 A1* | 12/2020 | Lilak | H10B 43/50 |
| 2020/0411480 A1* | 12/2020 | Yang | H01L 25/18 |
| 2021/0265364 A1* | 8/2021 | Huang | H10B 43/20 |
| 2021/0375901 A1* | 12/2021 | Oh | H10D 64/252 |
| 2021/0383874 A1* | 12/2021 | Oh | H10B 43/27 |
| 2021/0384160 A1* | 12/2021 | Oh | G11C 16/10 |
| 2022/0005820 A1* | 1/2022 | Kim | H10B 41/40 |

\* cited by examiner

SEMICONDUCTOR MEMORY DEVICE INCLUDING STACKED SEMICONDUCTOR LAYERS

CROSS-REFERENCE TO RELATED APPLICATION

The present application claims priority under 35 U.S.C. § 119(a) to Korean Patent Application No. 10-2021-0177044 filed in the Korean Intellectual Property Office on Dec. 10, 2021, which is incorporated herein by reference in its entirety.

BACKGROUND

1. Technical Field

Various embodiments generally relate to a semiconductor technology, and more particularly, to a semiconductor memory device.

2. Related Art

A memory device with a two-dimensional or planar structure has been developed to store more data in the same area by using fine patterning processes. However, as the line width of a circuit is narrowed due to the demand for high integration, the interference between memory cells becomes critical, which can result in various limitations such as degradation in performance. Of course, in addition to such structural limitations, there is a problem in that an increase in manufacturing cost is inevitable because the introduction of expensive equipment is required to pattern a fine line width.

As an alternative to overcome limitations of two-dimensional memory devices, a three-dimensional memory device has been proposed. A three-dimensional memory device has advantages in that a larger capacity may be realized within the same area by increasing the number of stacks through stacking memory cells in a vertical direction, thereby providing high performance and excellent power efficiency.

In addition to the technique of stacking memory cells in the vertical direction, a technique of reducing the area of a semiconductor memory device is being developed in which a logic circuit, which controls the operation of the memory cells, is disposed to overlap with the memory cells in the vertical direction.

SUMMARY

Various embodiments of the present disclosure are directed to providing a semiconductor memory device having a reduced size or area.

In an embodiment, a semiconductor memory device may include: a first semiconductor layer including a memory cell array; a second semiconductor layer including a first substrate and a page buffer circuit that is configured on the first substrate; a third semiconductor layer, disposed between the first semiconductor layer and the second semiconductor layer in a vertical direction, and including a second substrate and a second logic circuit that is configured on an element region of the second substrate; and a first contact plug passing through a coupling region of the second substrate, which overlaps the page buffer circuit in the vertical direction.

In an embodiment, a semiconductor memory device may include: a memory cell array included in a first semiconductor layer; a first substrate included in a second semiconductor layer; a first logic circuit included in the second semiconductor layer, disposed in an element region of the first substrate, and including a page buffer circuit; a second substrate included in a third semiconductor layer which is disposed between the first semiconductor layer and the second semiconductor layer in a vertical direction; a second logic circuit included in the third semiconductor layer, and disposed on an element region of the second substrate; and a plurality of contact plugs passing through coupling regions of the second substrate to extend to the second semiconductor layer, wherein at least a part of the coupling regions is configured to overlap the page buffer circuit in the vertical direction.

DETAILED DESCRIPTION

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

Figure 1:
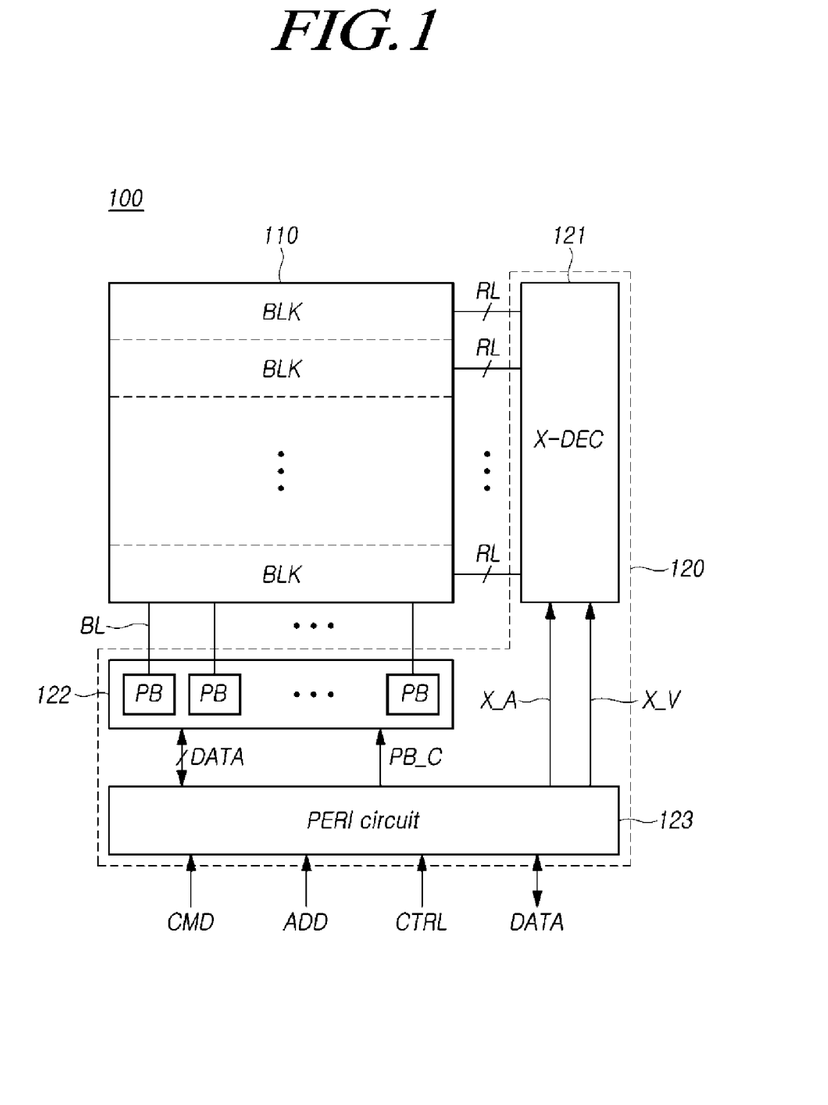
FIG. 1 is a block diagram schematically illustrating a semiconductor memory device in accordance with an embodiment of the present disclosure.

FIG. 1 is a block diagram schematically illustrating a semiconductor memory device in accordance with an embodiment of the disclosure.

Referring to FIG. 1, a semiconductor memory device 100 in accordance with an embodiment of the disclosure may include a memory cell array 110 and a logic circuit 120. The logic circuit 120 may include a row decoder (X-DEC) 121, a page buffer circuit 122, and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, which are coupled in series. In the following description of a memory cell array 110, memory cells are illustrated as stacked in a vertical direction, but the present invention is not limited thereto.

The memory cell array 110 may be coupled to the row decoder 121 through row lines RL. The row lines RL may include select lines and a plurality of word lines. The select lines may include at least one drain select line and at least one source select line. The memory cell array 110 may be coupled to the page buffer circuit 122 through bit lines BL.

The row decoder 121 may select any one among the memory blocks BLK included in the memory cell array 110, in response to a row address X_A provided from the peripheral circuit 123. The row decoder 121 may transfer an operating voltage X_V provided from the peripheral circuit 123, to row lines RL coupled to a memory block BLK that is selected from among the memory blocks BLK included in the memory cell array 110.

The page buffer circuit 122 may include a plurality of page buffers PB, which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data stored in a memory cell of the memory cell array 110 by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL, based on the data signal DATA received from the peripheral circuit 123, in response to the page buffer control signal PB_C, and thereby, may write data in a memory cell of the memory cell array 110. The page buffer circuit 122 may write or read data in or from a memory cell which is coupled to a word line activated by the row decoder 121.

The peripheral circuit 123 may receive a command signal CMD, an address signal ADD and a control signal CTRL from outside the semiconductor memory device 100, and may transmit and receive data DATA to and from a device outside the semiconductor memory device 100, such as, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the semiconductor memory device 100.

Electronic products in which semiconductor memory devices 100 are mounted continue to be miniaturized, so reduction in the size or area of the semiconductor memory devices is in high demand. As the number of memory cells increases due to the demand for higher capacity, however, the area of the logic circuit 120 also increases, which controls the memory cells and as a result, the number of wiring lines that couple the memory cell array 110 and the logic circuit 120 is increasing. Thus, it is necessary and advantageous to suppress increases in the size of the semiconductor memory device 100 that result from an increase in the area of the logic circuit 120 and an increase in the number of wiring lines.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may be the extending direction of row lines and the arrangement direction of bit lines, and the second direction SD may be the extending direction of the bit lines and the arrangement direction of the row lines. The first direction FD and the second direction SD may substantially perpendicularly intersect with each other. In the drawings, a direction indicated by an arrow and a direction opposite thereto indicate the same direction.

Figure 2:
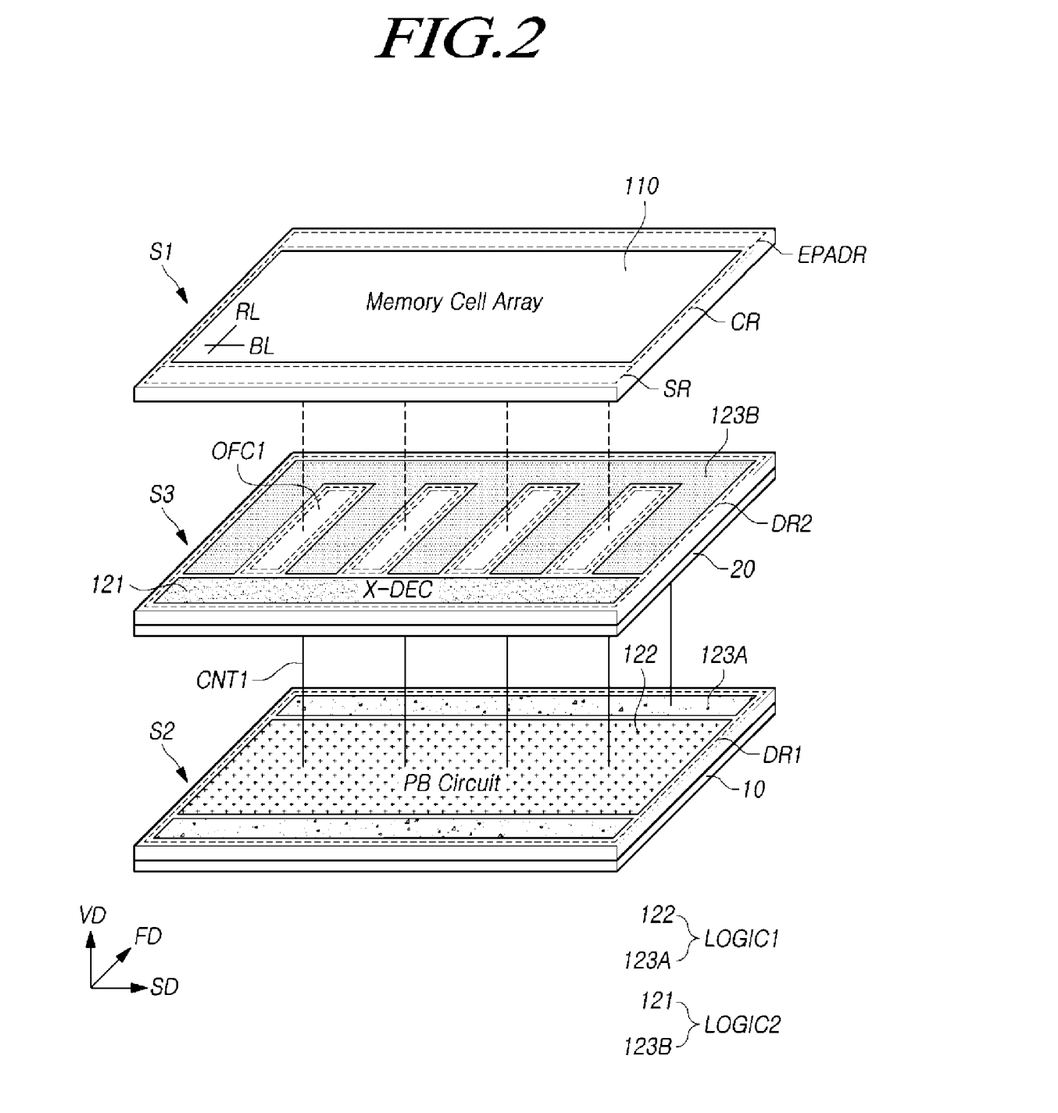
FIG. 2 is a diagram illustrating a schematic layout structure of a semiconductor memory device in accordance with an embodiment of the present disclosure.

FIG. 2 is a diagram illustrating a schematic layout structure of a semiconductor memory device in accordance with an embodiment of the present disclosure.

Referring to FIG. 2, a semiconductor memory device in accordance with an embodiment of the present disclosure may include a first semiconductor layer S1 including a memory cell array 110; a second semiconductor layer S2 including a first substrate 10 and a page buffer circuit (PB Circuit) 122, which is configured or disposed on the first substrate 10; a third semiconductor layer S3 disposed between the first semiconductor layer S1 and the second semiconductor layer S2 in the vertical direction VD and which includes a second substrate 20 and a second logic circuit LOGIC2 that is configured or disposed on a second element region DR2 of the second substrate 20; and a first contact plug CNT1 passing through a first coupling region OFC1 of the second substrate 20 which overlaps the page buffer circuit 122 in the vertical direction VD, to extend to the second semiconductor layer S2.

In FIG. 2, the first semiconductor layer S1 may include a cell region CR, a slimming region SR and an external pad region EPADR. The slimming region SR may be configured to be adjacent to the cell region CR in the first direction FD. The external pad region EPADR may be configured, for example, at an edge of the first semiconductor layer S1, to have a shape extending in the second direction SD.

The memory cell array 110 may be configured or disposed in the cell region CR. As will be described later with reference to FIG. 3, the first semiconductor layer S1 may include a plurality of electrode layers and a plurality of interlayer dielectric layers that are alternately stacked on the bottom surface of a source plate, a plurality of cell plugs that pass through the plurality of electrode layers and the plurality of interlayer dielectric layers in the vertical direction VD to extend to the source plate, and a plurality of bit lines BL that are coupled to the plurality of cell plugs. The plurality of cell plugs may be coupled with the plurality of electrode layers to configure a plurality of memory cells, which are three-dimensionally arranged.

Although not illustrated, the plurality of electrode layers and the plurality of interlayer dielectric layers may extend from the cell region CR to the slimming region SR in the first direction FD, and pad regions of the electrode layers may be disposed in the slimming region SR. A contact may be coupled to the pad region of each electrode layer. The electrode layers may be coupled to a row decoder 121 through the contacts coupled to the pad regions.

The first substrate 10 of the second semiconductor layer S2 may include a first element region DR1. The page buffer circuit 122 may be disposed on the first element region DR1 of the first substrate 10, and may be configured or disposed to overlap with the memory cell array 110 in the vertical direction VD. Although not illustrated, a plurality of page buffers included in the page buffer circuit 122 may be two-dimensionally arranged in the first direction FD and the second direction SD. The plurality of page buffers included in the page buffer circuit 122 may be disposed in a plurality of rows in the second direction SD.

The second substrate 20 of the third semiconductor layer S3 may include a second element region DR2 and the first coupling region OFC1. As described above, the first coupling region OFC1 may be configured or disposed to overlap the page buffer circuit 122 in the vertical direction VD. In addition, the first coupling region OFC1 may be disposed not to overlap with the external pad region EPADR in the vertical direction VD.

For example, the first coupling region OFC1 may be configured to have a line or bar shape extending in the first direction FD, which is also a direction in which the bit lines BL are arranged. The first coupling region OFC1 may extend in the first direction FD from an edge of the row decoder (X-DEC) 121. A plurality of first coupling regions OFC1 may be provided and arranged in the second direction SD as a direction in which the rows of the page buffers are arranged. The plurality of first coupling regions OFC1 may be arranged at a regular pitch in the second direction SD. The second element region DR2 may be an area that is outside of the first coupling regions OFC1. The area of the second element region DR2 may be smaller than the area of the first element region DR1. The first contact plugs CNT1 may pass vertically through the first coupling regions OFC1, and do not pass through or overlap in the vertical direction VD with the second element region DR2 and the row decoder 121.

The row decoder 121 may be configured or disposed on the second element region DR2 of the second substrate 20. The row decoder 121 may be have at least a portion that overlaps with the slimming region SR of the first semiconductor layer S1 in the vertical direction VD. Although the present embodiment illustrates the row decoder 121 as configured on the second element region DR2 of the second substrate 20, the present disclosure is not limited thereto. In other examples, the row decoder 121 may be configured or disposed on the first element region DR1 of the first substrate 10, or may be divided into two parts to be configured on the first element region DR1 of the first substrate 10 and the second element region DR2 of the second substrate 20, respectively.

A peripheral circuit 123 may be divided into a first peripheral circuit 123A and a second peripheral circuit 123B on the first element region DR1 of the first substrate 10 and the second element region DR2 of the second substrate 20, respectively. Neither the first peripheral circuit 123A nor the second peripheral circuit 123B overlaps with the first coupling region OFC1.

The page buffer circuit 122 and the first peripheral circuit 123A of the second semiconductor layer S2 may configure a first logic circuit LOGIC1. The first logic circuit LOGIC1 may be disposed on the first element region DR1 of the first substrate 10.

The row decoder 121 and the second peripheral circuit 123B of the third semiconductor layer S3 may configure the second logic circuit LOGIC2. The second logic circuit LOGIC2 may be disposed on the second element region DR2 of the second substrate 20. The second logic circuit LOGIC2 is not disposed in the first coupling regions OFC1.

In the first coupling regions OFC1, a plurality of first contact plugs CNT1 may pass through the second substrate 20 to extend to the second semiconductor layer S2.

For example, the first contact plug CNT1 may be a column coupling plug that couples a bit line BL of the memory cell array 110 of the first semiconductor layer S1 and the page buffer circuit 122 of the second semiconductor layer S2. FIG. 2 illustrates, for example, the first contact plug CNT1 as a column coupling plug, but the present disclosure is not limited thereto. In another example, the first contact plug CNT1 may include a signal transmission plug for transferring a signal to the first logic circuit LOGIC1 of the second semiconductor layer S2. In still another example, the first contact plug CNT1 may include a power transmission plug for transferring power to the first logic circuit LOGIC1 of the second semiconductor layer S2.

For better understanding, FIG. 2 illustrates that the first semiconductor layer S1 and the third semiconductor layer S3 are separated from each other and the third semiconductor layer S3 and the second semiconductor layer S2 are separated from each other. However, it should be understood that FIG. 2 is an exploded view, and that in the semiconductor device, the bottom surface of the first semiconductor layer S1 and the top surface of the third semiconductor layer S3 are in contact with each other and the bottom surface of the third semiconductor layer S3 and the top surface of the second semiconductor layer S2 are in contact with each other.

The first semiconductor layer S1 may be included in a first wafer, and the second semiconductor layer S2 and the third semiconductor layer S3 may be included in a second wafer, which is bonded to the first wafer. After the first semiconductor layer S1 including the memory cell array 110 is formed in the first wafer, and the second semiconductor layer S2 including the first logic circuit LOGIC1 and the third semiconductor layer S3 including the second logic circuit LOGIC2 are formed in the second wafer, the semiconductor memory device may be configured by bonding the first wafer and the second wafer. The semiconductor memory devices in accordance with embodiments of the present disclosure may have a POC (peripheral over cell) structure.

Figure 3:
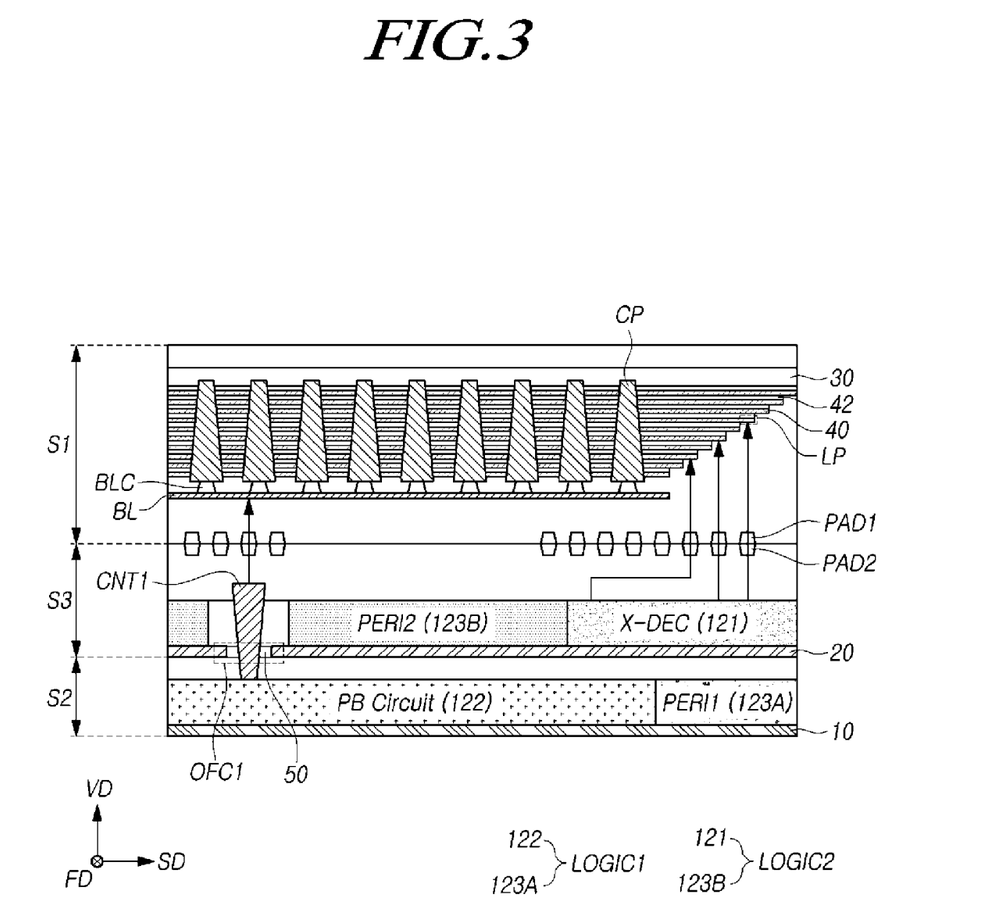
FIG. 3 is a cross-sectional view illustrating a semiconductor memory device in accordance with an embodiment of the present disclosure.

FIG. 3 is a cross-sectional view illustrating a semiconductor memory device in accordance with an embodiment of the present disclosure.

Referring to FIG. 3, a first semiconductor layer S1 may include a source plate 30. A plurality of electrode layers 40 and a plurality of interlayer dielectric layers 42 are alternately stacked on the bottom surface of the source plate 30. A plurality of cell plugs CP pass through the plurality of electrode layers 40 and the plurality of interlayer dielectric layers 42 and extend to the source plate 30.

The electrode layers 40 may include a conductive material. For example, the electrode layers 40 may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). The electrode layers 40 may configure row lines. For example, among the electrode layers 40, at least one electrode layer 40 from the uppermost electrode layer 40 may configure a source select line. Among the electrode layers 40, at least one electrode layer 40 from the lowermost electrode layer 40 may configure a drain select line. The electrode layers 40 between the source select line and the drain select line may configure word lines. The interlayer dielectric layers 42 may include silicon oxide.

Each of the electrode layers 40 may include a pad region LP. The pad regions LP of the electrode layers 40 may be disposed in a stepwise manner to configure a step structure. Referring to FIG. 2, the pad regions and step structure may be disposed in a slimming region.

Although not illustrated, the cell plug CP may include a channel layer and a gate dielectric layer. The channel layer may include polysilicon or monocrystalline silicon, and may include, in some regions, a p-type impurity such as boron (B). The gate dielectric layer may have a shape that surrounds an outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

A source select transistor may be configured in areas or regions where the source select line surrounds the cell plug CP. A memory cell may be configured in areas or regions where the word line surrounds the cell plug CP. A drain select transistor may be configured in areas or regions where the drain select line surrounds the cell plug CP. A bit line contact BLC may be formed on the bottom of the cell plug CP to couple a cell plug CP and a bit line BL.

The first semiconductor layer S1 may include a plurality of first bonding pads PAD1 on one surface thereof, which is bonded to the third semiconductor layer S3. Each of the bit lines BL and the pad regions LP of the electrode layers 40 may be coupled to a corresponding first bonding pad PAD1 through a wiring structure (not illustrated). Lines with arrows in FIG. 3 not indicate the actual shape or actual location of the wiring structure but represent electrical paths provided by the wiring structure.

The third semiconductor layer S3 may include a plurality of second bonding pads PAD2 on one surface thereof. The plurality of second bonding pads PAD2 are bonded to the first bonding pads PAD1, the one surface of the third semiconductor layer S3 is bonded to the first semiconductor layer S1. Each of the row decoder 121 and the page buffer circuit 122 may be coupled to a corresponding second bonding pad PAD2 through a wiring structure (not illustrated).

The first coupling region OFC1 of the second substrate 20 may be configured to overlap the page buffer circuit 122 in the vertical direction VD. The second logic circuit LOGIC2, that is, the row decoder 121 and the second peripheral circuit 123B, may be disposed outside the first coupling region OFC1 and on the second element region DR2 of the second substrate 20. The second logic circuit LOGIC2 is not disposed in the first coupling region OFC1.

In the first coupling region OFC1, the first contact plug CNT1 may pass through the second substrate 20 in the vertical direction VD to extend to the second semiconductor layer S2. A dielectric layer pattern 50 may be formed between the first contact plug CNT1 and the second substrate 20 to insulate the first contact plug CNT1 from the second substrate 20. FIG. 3 illustrates, for example, the first contact plug CNT1 as a column coupling plug that couples the page buffer circuit 122 of the second semiconductor layer S2 and the bit line BL of the first semiconductor layer S1.

Figure 4:
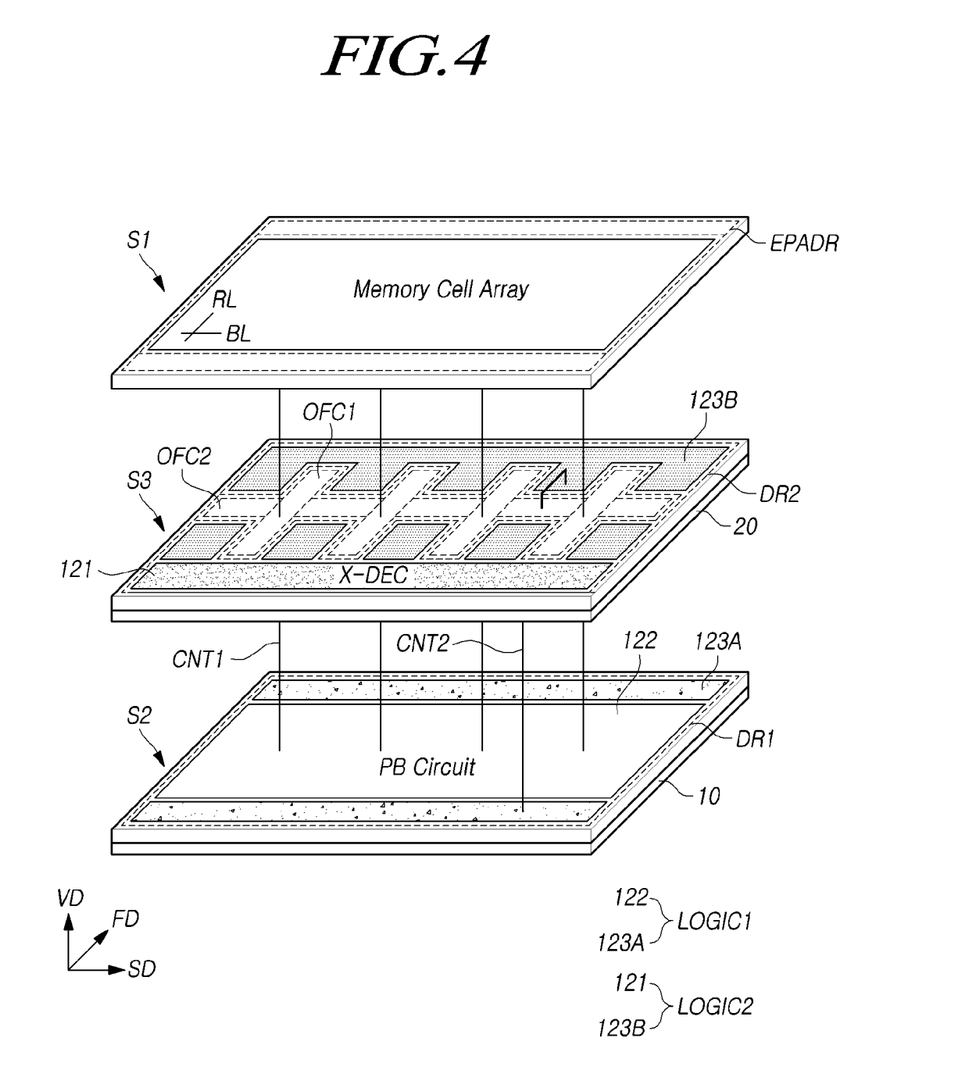
FIG. 4 is a diagram illustrating a schematic layout structure of a semiconductor memory device in accordance with another embodiment of the present disclosure.

FIG. 4 is a diagram illustrating a schematic layout structure of a semiconductor memory device in accordance with another embodiment of the present disclosure.

Referring to FIG. 4, as compared to the FIG. 3, a second substrate 20 of the third semiconductor layer S3 may further include a second coupling region OFC2, which overlaps the page buffer circuit 122 in the vertical direction VD. In addition, the second coupling region OFC2 may be configured not to overlap with the external pad region EPADR in the vertical direction VD.

The second coupling region OFC2 may be configured to have a line or bar shape extending in the second direction SD, which is also the direction in which the bit lines BL extend. In an example, the second coupling region OFC2 may intersect each of the plurality of the first coupling regions OFC1 in any location along the first direction FD, and the plurality of the first coupling regions OFC1 arranged in the second direction SD may appear similar to hash marks along the second coupling region OFC2. The second coupling region OFC2 may be coupled to the first coupling region OFC1. The second element region DR2 may be an area outside of the first coupling regions OFC1 and the second coupling region OFC2. The area of the second element region DR2 may be smaller than the area of the first element region DR1. The first contact plugs CNT1 may pass vertically through the first coupling regions OFC1 but not through the second element region DR2. The second contact plugs CNT2 may pass vertically through the second coupling regions OFC2 but not through the second element region DR2. The first peripheral circuit 123A and the second peripheral circuit 123B might not overlap with the second coupling region OFC2.

A second contact plug CNT2 may pass through the second coupling region OFC2 of the second substrate 20 in the vertical direction VD to extend to the second semiconductor layer S2. For example, the second contact plug CNT2 may include a logic coupling plug that couples the first logic circuit LOGIC1 of the second semiconductor layer S2 and the second logic circuit LOGIC2 of the third semiconductor layer S3. In another example, the second contact plug CNT2 may include a signal transmission plug for transferring a signal to the first logic circuit LOGIC1 of the second semiconductor layer S2. In still another example, the second contact plug CNT2 may include a power transmission plug for transferring power to the first logic circuit LOGIC1 of the second semiconductor layer S2.

Figure 5:
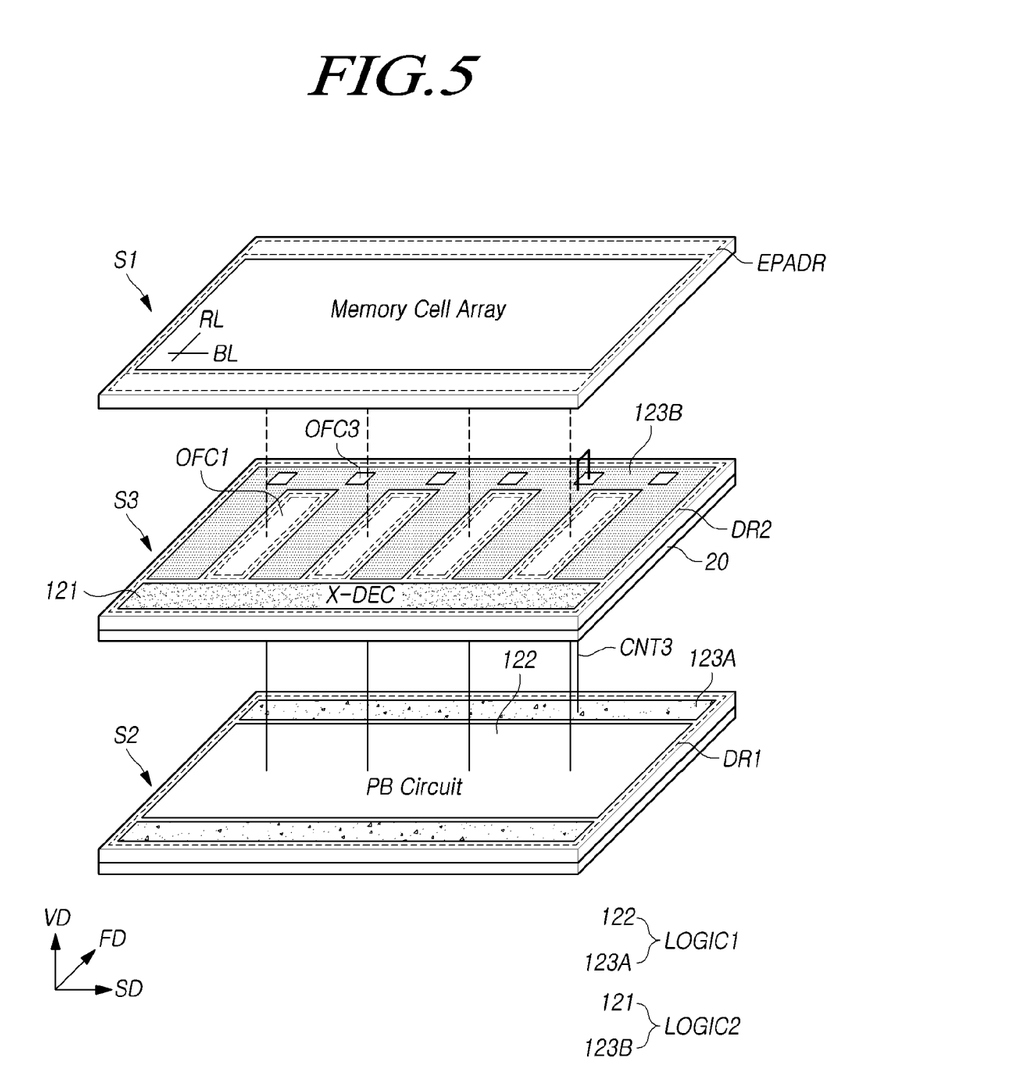
FIG. 5 is a diagram illustrating a schematic layout structure of a semiconductor memory device in accordance with still another embodiment of the present disclosure.

FIG. 5 is a diagram illustrating a schematic layout structure of a semiconductor memory device in accordance with still another embodiment of the present disclosure.

Referring to FIG. 5, as compared to FIG. 3, the second substrate 20 of the third semiconductor layer S3 may further include a third coupling region OFC3. The third coupling region OFC3 may not overlap the page buffer circuit 122 in the vertical direction VD. In addition, the third coupling region OFC3 may be configured to overlap with the external pad region EPADR in the vertical direction VD.

The second element region DR2 may be configured outside of the first coupling regions OFC1 and the third coupling region OFC3. The area of the second element region DR2 may be smaller than the area of the first element region DR1. The first contact plugs CNT1 may pass vertically through the first coupling regions OFC1 but not through the second element region DR2. The third contact plugs CNT3 may pass vertically through the third coupling regions OFC3 but not through the second element region DR2. In an example, the third coupling regions OFC3 may be arranged in a row extending in the second direction and arranged to vertically overlap with the external pad region EPADR and the first peripheral circuit 123A.

A third contact plug CNT3 may pass through the third coupling region OFC3 of the second substrate 20 in the vertical direction VD to extend to the second semiconductor layer S2. For example, the third contact plug CNT3 may include a logic coupling plug that couples the first logic circuit LOGIC1 of the second semiconductor layer S2 and the second logic circuit LOGIC2 of the third semiconductor layer S3. In another example, the third contact plug CNT3 may include at least one of a signal transmission plug for transferring a signal to the first logic circuit LOGIC1 of the second semiconductor layer S2 and a power transmission plug for transferring power to the first logic circuit LOGIC1 of the second semiconductor layer S2. In still another example, the third contact plug CNT3 may include a discharge contact plug that configures a discharge path for discharging the charges of the third semiconductor layer S3 to the first substrate 10 of the second semiconductor layer S2.

Figure 6:
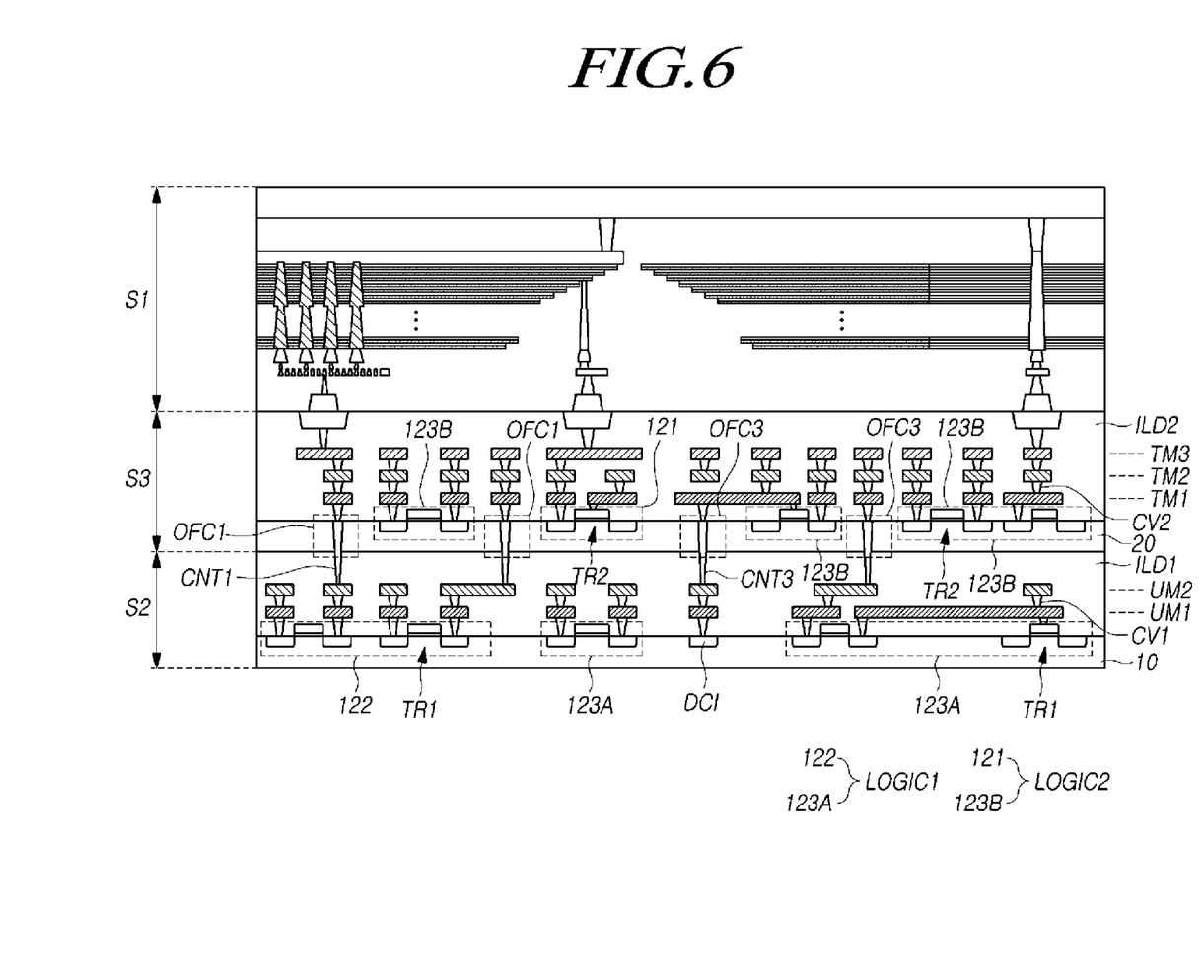
FIG. 6 is a cross-sectional view illustrating the semiconductor memory device of FIG. 5.

FIG. 6 is a cross-sectional view illustrating the semiconductor memory device of FIG. 5. Although FIG. 6 shows an example including first and third coupling regions OFC1 and OFC3, but the present invention is not limited thereto. The present invention may include the first coupling region OFC1 and may not include the third coupling region OFC3 as shown in FIG. 4. Or, the present invention may include the first and the second coupling regions OFC1 and OFC2 and may not include the third coupling region OFC3 as shown in FIG. 5.

Referring to FIG. 6, each of the page buffer circuit 122 and the first peripheral circuit 123A may include a plurality of first transistors TR1. The first logic circuit LOGIC1 of the second semiconductor layer S2 may include a plurality of first transistors TR1.

The second semiconductor layer S2 may include at least one bottom wiring layer. For example, the second semiconductor layer S2 may include a first bottom wiring layer UM1, which is disposed over the first logic circuit LOGIC1, and a second bottom wiring layer UM2, which is disposed over the first bottom wiring layer UM1. The first logic circuit LOGIC1, the first bottom wiring layer UM1 and the second bottom wiring layer UM2 may be coupled to one another through contacts CV1. A dielectric layer ILD1 may be formed on the first substrate 10 to cover the first logic circuit LOGIC1, the bottom wiring layers UM1 and UM2 and the contacts CV1.

Each of the row decoder 121 and the second peripheral circuit 123B may include a plurality of second transistors TR2. The second logic circuit LOGIC2 may include a plurality of second transistors TR2.

The third semiconductor layer S3 may include a plurality of top wiring layers. For example, the third semiconductor layer S3 may include a first top wiring layer TM1, which is disposed over the second logic circuit LOGIC2, a second top wiring layer TM2, which is disposed over the first top wiring layer TM1, and a third top wiring layer TM3, which is disposed over the second top wiring layer TM2. The second logic circuit LOGIC2, the first top wiring layer TM1, the second top wiring layer TM2 and the third top wiring layer TM3 may be coupled to one another through contacts CV2. A dielectric layer ILD2 may be formed on the second substrate 20 to cover the second logic circuit LOGIC2, the top wiring layers TM1, TM2 and TM3 and the contacts CV2.

The thinnest gate dielectric layer of the first transistors TR1 may be thicker than the thinnest gate dielectric layer of the second transistors TR2. For example, the first transistors TR1 may include a low voltage transistor and a high voltage transistor but may not include a thin film transistor. The second transistors TR2, however, may include a thin film transistor, a low voltage transistor and a high voltage transistor. The gate dielectric layer is thickest in a high voltage transistor, thinner in a low voltage transistor, and thinnest in a thin film transistor.

After the first transistors TR1 are formed, the bottom wiring layers UM1 and UM2, the contacts CV1, the dielectric layer ILD1 and the second substrate 20 are formed. Subsequently, the second transistors TR2 are formed on the second substrate 20. Accordingly, the first transistors TR1 are exposed to more manufacturing processes than the second transistors TR2. The greater the number of manufacturing processes to which a transistor is to be exposed, the more hot carriers will be trapped in the gate dielectric layers of the transistors. Thus, the properties of the gate dielectric layers will change compared to when the transistor was initially manufactured, which will degrade the performance of the transistor. The thinner the thickness of a gate dielectric layer in a transistor, the more vulnerable the transistor is to degradation in performance due to hot carriers.

By disposing the row decoder 121 and the second peripheral circuit 123B in the third semiconductor layer S3, including a thin film transistor with a thin gate dielectric layer, and by disposing the page buffer circuit 122 and the first peripheral circuit 123A in the second semiconductor layer S2, without a thin film transistor, semiconductor memory devices in accordance with the present embodiment may suppress, mitigate or prevent performance degradation.

A discharge region DCI may be configured in the first substrate 10. The discharge region DCI may be formed by implanting an impurity ion into the first substrate 10, where the impurity ion is of a conductivity type that is different from that of the first substrate 10. For example, the first substrate 10 may be an n-type semiconductor substrate, and the discharge region DCI may be a p-type impurity region that is formed by implanting a p-type impurity ion into the n-type semiconductor substrate. The discharge region DCI and the first substrate 10 may configure a PN diode.

At least one of the second substrate 20 and the top wiring layers TM1 to TM3 of the third semiconductor layer S3 may be coupled to the third contact plug CNT3, which passes through the third coupling region OFC3 of the second substrate 20, and may be coupled to the discharge region DCI through the third contact plug CNT3. The charges of the third semiconductor layer S3 may be discharged to the first substrate 10 through the third contact plug CNT3 and the discharge region DCI. The third contact plug CNT3 may configure a discharge path for discharging the charges of the third semiconductor layer S3.

As described above, the third semiconductor layer S3 is formed on the dielectric layer ILD1 of the second semiconductor layer S2. Accordingly, because the third semiconductor layer S3 is electrically floated during the manufacturing process, the charges generated during the manufacturing process may not be discharged to the outside, and may accumulate in the third semiconductor layer S3 and cause arcing.

If arcing occurs, problems may arise in that contaminant particles may result and such particles can result in increases in defects and damage to a wafer or in the malfunction of process equipment. According to the present embodiment, because the charges of the third semiconductor layer S3 may be discharged to the discharge region DCI of the second semiconductor layer S2 through the third contact plug CNT3, it is possible to prevent arcing occurrences.

At least one of the bottom wiring layers UM1 and UM2 of the second semiconductor layer S2 may be coupled to the discharge region DCI. The charges of the bottom wiring layers UM1 and UM2 of the second semiconductor layer S2 may be discharged to the first substrate 10 through the discharge region DCI.

At least one of the second substrate 20 and the top wiring layers TM1 to TM3 of the third semiconductor layer S3 may be coupled in common to the discharge region DCI with at least one of the bottom wiring layers UM1 and UM2 of the second semiconductor layer S2. At least one of the second substrate 20 and the top wiring layers TM1 to TM3 of the third semiconductor layer S3 and at least one of the bottom wiring layers UM1 and UM2 of the second semiconductor layer S2 may share the discharge region DCI.

Although the present embodiment illustrates that a discharge path is configured using the third contact plug CNT3, which passes through the third coupling region OFC3 of the second substrate 20 and does not overlap the page buffer circuit 122, the present disclosure is not limited thereto. A discharge path may be configured using the first contact plug CNT1, which passes through the first coupling region OFC1 of the second substrate 20 and overlaps the page buffer circuit 122, or may be configured using the second contact plug CNT2 (see FIG. 4), which passes through the second coupling region OFC2 (see FIG. 4) of the second substrate 20 overlapping the page buffer circuit 122.

According to the embodiments of the present disclosure, by configuring at least one of coupling regions in which contact plugs are disposed to overlap a page buffer circuit, area consumption by the coupling regions may be reduced, whereby it is possible to reduce the size of a semiconductor memory device.

Figure 7:
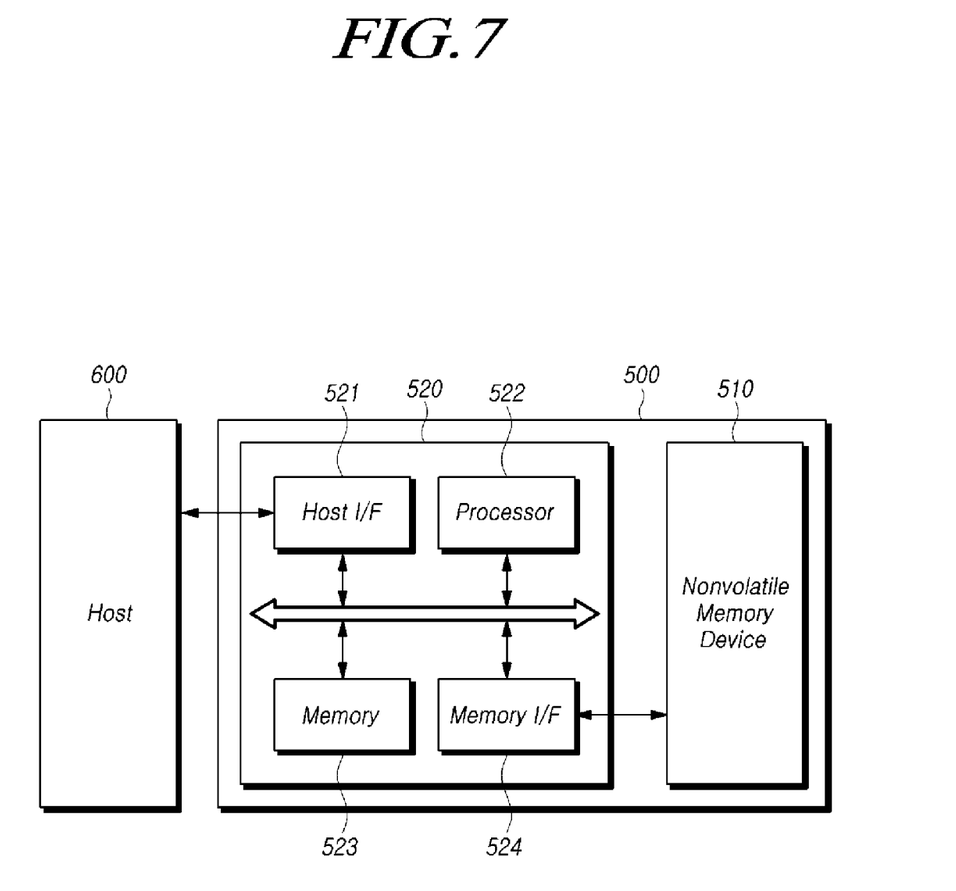
FIG. 7 is a block diagram schematically illustrating a memory system including a semiconductor memory device in accordance with embodiments of the present disclosure.

FIG. 7 is a block diagram schematically illustrating a memory system including a semiconductor memory device in accordance with embodiments of the present disclosure.

Referring to FIG. 7, a memory system 500 may store data to be accessed by a host 600 such as a mobile phone, an MP3 player, a laptop computer, a desktop computer, a game player, a TV, an in-vehicle infotainment system, and so forth.

The memory system 500 may be manufactured as any one of various kinds of storage devices according to the protocol of an interface, which is electrically coupled to the host 600. For example, the memory system 500 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 500 may be manufactured as any one among various kinds of package types. For example, the memory system 500 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 500 may include a nonvolatile memory device 510 and a controller 520.

The nonvolatile memory device 510 may operate as a storage medium of the memory system 500. The nonvolatile memory device 510 may be configured by any one of various types of nonvolatile memory devices, depending on the type of memory cells, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound.

While FIG. 7 illustrates that the memory system 500 includes one nonvolatile memory device 510, this is only for the sake of convenience in explanation, and the memory system 500 may include a plurality of nonvolatile memory devices. The present disclosure may be applied the same to the memory system 500 including a plurality of nonvolatile memory devices. The nonvolatile memory device 510 may include the semiconductor memory device according to embodiments of the present disclosure.

The controller 520 may control general operations of the memory system 500 through driving of firmware or software loaded in a memory 523. The controller 520 may decode and drive a code type instruction or algorithm such as firmware or software. The controller 520 may be implemented in the form of hardware or in a combined form of hardware and software.

The controller 520 may include a host interface Host I/F 521, a processor 522, the memory 523 and a memory interface Memory I/F 524. Although not illustrated in FIG. 7, the controller 520 may further include an ECC (error correction code) engine, which generates a parity by ECC-encoding write data provided from the host 600 and ECC-decodes read data, read from the nonvolatile memory device 510, by using the parity.

The host interface 521 may interface the host 600 and the memory system 500 in correspondence to the protocol of the host 600. For example, the host interface 521 may communicate with the host 600 through any one of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 522 may be configured by a micro control unit (MCU) or a central processing unit (CPU). The processor 522 may process a request transmitted from the host 600. In order to process a request transmitted from the host 600, the processor 522 may drive a code type instruction or algorithm, that is, firmware, loaded in the memory 523, and may control the internal function blocks such as the host interface 521, the memory 523 and the memory interface 524 and the nonvolatile memory device 510.

The processor 522 may generate control signals for controlling the operation of the nonvolatile memory device 510, on the basis of requests transmitted from the host 600, and may provide the generated control signals to the nonvolatile memory device 510 through the memory interface 524.

The memory 523 may be configured by a random access memory such as a dynamic random access memory (DRAM) or a static random access memory (SRAM). The memory 523 may store firmware to be driven by the processor 522. Also, the memory 523 may store data necessary for driving the firmware, for example, metadata. Namely, the memory 523 may operate as a working memory of the processor 522.

The memory 523 may be configured to include a data buffer for temporarily storing write data to be transmitted from the host 600 to the nonvolatile memory device 510 or read data to be transmitted from the nonvolatile memory device 510 to the host 600. In other words, the memory 523 may operate as a buffer memory. The memory 523 may receive and store map data from the nonvolatile memory device 510 when the memory system 500 is booted.

The memory interface 524 may control the nonvolatile memory device 510 under the control of the processor 522. The memory interface 524 may also be referred to as a memory controller. The memory interface 524 may provide control signals to the nonvolatile memory device 510. The control signals may include a command, an address, an operation control signal and so forth for controlling the nonvolatile memory device 510. The memory interface 524 may provide data, stored in the data buffer, to the nonvolatile memory device 510, or may store data, transmitted from the nonvolatile memory device 510, in the data buffer.

The controller 520 may further include a map cache (not illustrated) which caches map data referred to by the processor 522 among map data stored in the memory 523.

Figure 8:
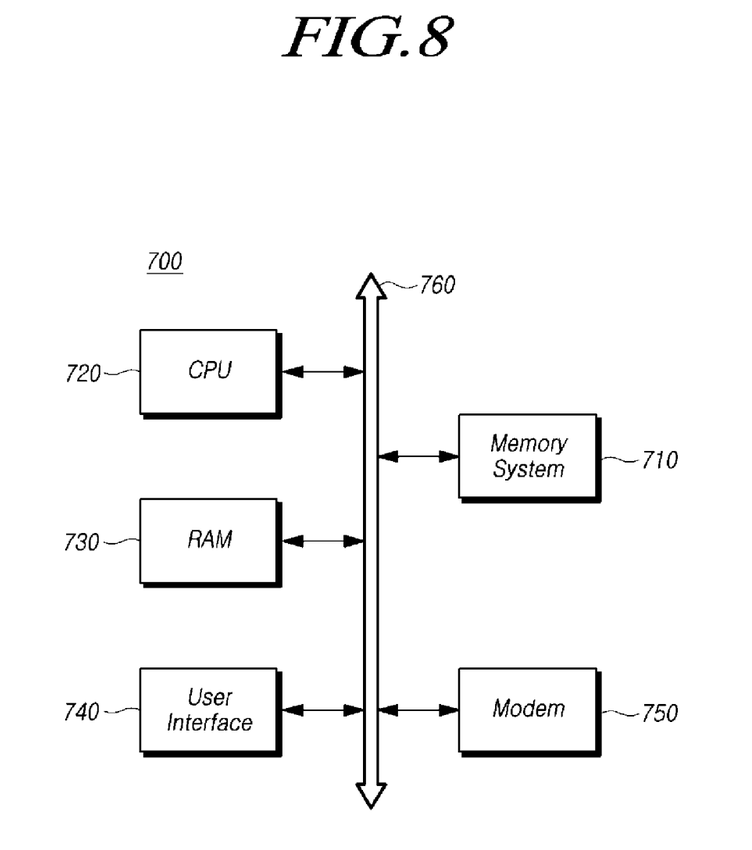
FIG. 8 is a block diagram schematically illustrating a computing system including a semiconductor memory device in accordance with embodiments of the present disclosure.

FIG. 8 is a block diagram schematically illustrating a computing system including a memory device in accordance with embodiments of the disclosure.

Referring to FIG. 8, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A semiconductor memory device comprising:
a first semiconductor layer including a memory cell array;
a second semiconductor layer including a first substrate and a page buffer circuit that is configured on the first substrate;
a third semiconductor layer, disposed between the first semiconductor layer and the second semiconductor layer in a vertical direction, and including a second substrate that is divided into an element region and a coupling region, and a second logic circuit that is configured on the element region of the second substrate; and
a first contact plug passing through the coupling region of the second substrate, which overlaps the page buffer circuit in the vertical direction,
wherein the second semiconductor layer includes a first transistor and the third semiconductor layer includes a second transistor and a gate dielectric layer of the first transistor is thicker than a gate dielectric layer of the second transistor.

2. The semiconductor memory device according to claim 1, wherein
the first semiconductor layer is included in a first wafer, and
the second semiconductor layer and the third semiconductor layer are included in a second wafer, which is bonded to the first wafer.

3. The semiconductor memory device according to claim 1, wherein the first contact plug is configured to couple a bit line of the memory cell array and the page buffer circuit.

4. The semiconductor memory device according to claim 1,
wherein the first semiconductor layer further comprises bit lines coupling the memory cell array to the page buffer circuit, and the coupling region has a shape extending in a direction in which the bit lines are arranged.

5. The semiconductor memory device according to claim 1, wherein the first contact plug is configured to transfer a signal or power to the second semiconductor layer.

6. The semiconductor memory device according to claim 1,
wherein the first semiconductor layer further comprises bit lines coupling the memory cell array to the page buffer circuit, and
wherein the second substrate further comprises:
an additional coupling region extending in a direction in which the bit lines extend; and
a second contact plug passing through the additional coupling region of the second substrate in the vertical direction to extend to the second semiconductor layer.

7. The semiconductor memory device according to claim 6, wherein the second contact plug is configured to couple a first logic circuit of the second semiconductor layer and the second logic circuit.

8. The semiconductor memory device according to claim 6, wherein the second contact plug is configured to transfer a signal or power to the second semiconductor layer.

9. A semiconductor memory device comprising:
a memory cell array included in a first semiconductor layer;
a first substrate included in a second semiconductor layer;
a first logic circuit included in the second semiconductor layer, disposed in an element region of the first substrate, and including a page buffer circuit;
a second substrate included in a third semiconductor layer which is disposed between the first semiconductor layer and the second semiconductor layer in a vertical direction and is divided into an element region and a coupling region;
a second logic circuit included in the third semiconductor layer, and disposed on the element region of the second substrate; and
a plurality of contact plugs passing through the coupling regions of the second substrate to extend to the second semiconductor layer,
wherein at least a part of the coupling regions is configured to overlap the page buffer circuit in the vertical direction,
wherein the second semiconductor layer includes a first transistor and the third semiconductor layer includes a second transistor and a gate dielectric layer of the first transistor is thicker than a gate dielectric layer of the second transistor.

10. The semiconductor memory device according to claim 9, wherein
the first semiconductor layer is included in a first wafer, and
the second semiconductor layer and the third semiconductor layer are included in a second wafer, which is bonded to the first wafer.

11. The semiconductor memory device according to claim 9, further comprising:
a wiring layer included in the third semiconductor layer; and
a discharge region included in the first substrate,
wherein one of the plurality of contact plugs couples at least one of the second substrate and the wiring layer of the third semiconductor layer to the discharge region.

12. The semiconductor memory device according to claim 11, further comprising:
a wiring layer included in the second semiconductor layer,
wherein at least one of the second substrate and the wiring layer of the third semiconductor layer and the wiring layer of the second semiconductor layer are coupled in common to one discharge region.

13. The semiconductor memory device according to claim 9, wherein an area of the element region of the second substrate is smaller than an area of the element region of the first substrate.

14. The semiconductor memory device according to claim 9, wherein
the first logic circuit includes a plurality of transistors having gate dielectric layers, and the second logic circuit includes a plurality of transistors having gate dielectric layers, and
the thinnest gate dielectric layer of the first logic circuit is thicker than the thinnest gate dielectric layer of the second logic circuit.

15. The semiconductor memory device according to claim 1,
wherein the first semiconductor layer further comprises bit lines coupling the memory cell array to the page buffer circuit, and
wherein the coupling region is divided into a plurality of parallel line shapes arranged in the a direction in which the bit lines extend, with each line shape extending in a direction in which the bit lines are arranged.

16. The semiconductor memory device according to claim 15, wherein the coupling region further comprises a further line shape extending in the direction in which the bit lines extend and perpendicular to the plurality of parallel line shapes.

17. The semiconductor memory device according to claim 16, wherein the plurality of parallel line shapes are arranged as hash marks that intersect with the further line shape.

18. A semiconductor memory device comprising:
a memory cell array included in a first semiconductor layer;
a first substrate included in a second semiconductor layer;
a first logic circuit included in the second semiconductor layer, disposed in an element region of the first substrate, and including a page buffer circuit;
a second substrate included in a third semiconductor layer which is disposed between the first semiconductor layer and the second semiconductor layer in a vertical direction;
a second logic circuit included in the third semiconductor layer, and disposed on an element region of the second substrate; and
a plurality of contact plugs passing through coupling regions of the second substrate to extend to the second semiconductor layer,
wherein at least a part of the coupling regions is configured to overlap the page buffer circuit in the vertical direction,
wherein the first logic circuit includes a plurality of first transistors having gate dielectric layers, and the second logic circuit includes a plurality of second transistors having gate dielectric layers, and
the thinnest gate dielectric layer from among the gate dielectric layers of the plurality of first transistors is thicker than the thinnest gate dielectric layer from among the gate dielectric layers of the plurality of second transistors.

* * * * *